(12) United States Patent
Oyama et al.

(10) Patent No.: US 9,865,487 B2
(45) Date of Patent: Jan. 9, 2018

(54) SUBSTRATE STORAGE CONTAINER

(71) Applicant: MIRAIAL CO., LTD., Tokyo (JP)

(72) Inventors: Takaharu Oyama, Tokyo (JP); Tsuyoshi Nagashima, Tokyo (JP)

(73) Assignee: Miraial Co., Ltd., Tokyo (JP)

( * ) Notice: Subject to any disclaimer, the term of this patent is extended or adjusted under 35 U.S.C. 154(b) by 123 days.

(21) Appl. No.: 14/917,444

(22) PCT Filed: Sep. 11, 2013

(86) PCT No.: PCT/JP2013/074540
§ 371 (c)(1),
(2) Date: Mar. 8, 2016

(87) PCT Pub. No.: WO2015/037083
PCT Pub. Date: Mar. 19, 2015

(65) Prior Publication Data
US 2016/0225647 A1    Aug. 4, 2016

(51) Int. Cl.
*B65D 85/86* (2006.01)
*H01L 21/673* (2006.01)

(52) U.S. Cl.
CPC .. *H01L 21/67369* (2013.01); *H01L 21/67379* (2013.01); *B65D 2585/86* (2013.01)

(58) Field of Classification Search
CPC .......... H01L 21/6735; H01L 21/67353; H01L 21/67356; H01L 21/67373; H01L 21/67379; H01L 21/67383; H01L 21/67; H01L 21/673; H01L 21/67303; H01L 21/67309; H01L 21/67332; H01L 21/67326; H01L 21/67333; H01L 21/6734; H01L 21/67346

USPC .......................................... 206/710, 711, 712
See application file for complete search history.

(56) References Cited

U.S. PATENT DOCUMENTS

| | | | | |
|---|---|---|---|---|
| 5,570,987 A | * | 11/1996 | McKenna | ......... H01L 21/67373 414/416.01 |
| 5,711,427 A | * | 1/1998 | Nyseth | .............. H01L 21/67373 206/454 |
| 8,318,275 B2 | * | 11/2012 | Kudo | .................. B29C 45/1657 206/454 |
| 9,698,033 B2 | * | 7/2017 | Matsutori | ......... H01L 21/67376 |

(Continued)

FOREIGN PATENT DOCUMENTS

| | | |
|---|---|---|
| EP | 1004524 B1 | 12/2014 |
| JP | 2005-194009 A | 7/2005 |

(Continued)

*Primary Examiner* — Steven A. Reynolds
*Assistant Examiner* — Javier A Pagan
(74) *Attorney, Agent, or Firm* — Muncy, Geissler, Olds & Lowe, P.C.

(57) ABSTRACT

A substrate storing container that stores substrates composed of semiconductor wafers includes: a locked portion that is arranged at a center portion of an upper wall and is locked by a lifting member that can lift a container main body; in which the locked portion includes a plate-like flange portion having a lower face that faces the upper wall and an elastically deformable elastic member provided at a lower face of the flange portion and/or at a rim portion of the flange portion; and in which the locked portion is locked by the lifting member in a state in which the elastic member is sandwiched between the flange portion and the lifting member.

6 Claims, 7 Drawing Sheets

(56) References Cited

U.S. PATENT DOCUMENTS

| | | | | |
|---|---|---|---|---|
| 2002/0005369 A1* | 1/2002 | Nyseth | H01L 21/67373 | 206/711 |
| 2003/0010673 A1* | 1/2003 | Duban-Hu | H01L 21/67369 | 206/711 |
| 2005/0274645 A1* | 12/2005 | Hasegawa | H01L 21/67369 | 206/710 |
| 2006/0283774 A1* | 12/2006 | Hasegawa | H01L 21/67383 | 206/725 |
| 2009/0026109 A1* | 1/2009 | Hasegawa | H01L 21/67373 | 206/711 |
| 2011/0005967 A1* | 1/2011 | Gregerson | H01L 21/67383 | 206/711 |
| 2013/0037444 A1* | 2/2013 | Inoue | H01L 21/67383 | 206/711 |
| 2014/0138279 A1* | 5/2014 | Nagashima | B65D 43/02 | 206/525 |
| 2014/0367307 A1* | 12/2014 | Oyama | H01L 21/67383 | 206/711 |
| 2015/0279711 A1* | 10/2015 | Matsutori | H01L 21/67369 | 206/723 |
| 2015/0294882 A1* | 10/2015 | Matsutori | H01L 21/67369 | 206/723 |

FOREIGN PATENT DOCUMENTS

| | | |
|---|---|---|
| JP | 2009-176765 A | 8/2009 |
| JP | 2009-188287 A | 8/2009 |
| WO | WO 99/39994 A1 | 8/1999 |

* cited by examiner

CROSS-SECTIONAL VIEW A-A

FIG. 11C

CROSS-SECTIONAL VIEW B-B

FIG. 11D

CROSS-SECTIONAL VIEW C-C

FIG. 12

SUBSTRATE STORAGE CONTAINER

TECHNICAL FIELD

The present invention relates to a substrate storing container that stores substrates such as semiconductor wafers.

BACKGROUND ART

As a container that stores substrates such as semiconductor wafers, a substrate storing container has been known conventionally that has a container main body, a lid body, and a locked portion.

The container main body has a tubular wall portion having a container main body opening portion formed at one end, and having the other end closed. A wall portion includes a back wall, an upper wall, a lower wall, a first side wall, and a second side wall. A substrate storing space is formed in the container main body. The substrate storing space is formed by being surrounded by the wall portion and can store a plurality of substrates. The lid body can be removably attached to the container main body opening portion and can close the container main body opening portion. The locked portion is a rigid body made from hard resin and is provided at a center portion of the upper wall. The locked portion is hung from a lifting member of a wafer transport apparatus when lifting the substrate storing container with the wafer transport apparatus, etc. With such a configuration, the substrate storing container is lifted by the lifting member.

Since the substrate storing container is transported by way of being lifted by the lifting member of the wafer transport apparatus in the abovementioned way, vibration occurring at the wafer transport apparatus propagates directly to the container main body from the lifting member through the locked portion. The vibration propagated to the container main body then propagates to wafers stored in the substrate storing container, and thus the stored wafers vibrate. The vibration of the wafers causes friction between the wafers and grooved plates retaining the wafers, and thus causes damage to the wafers, occurrence of particles, and generation of static electricity. Furthermore, static electricity generated causes particles and the like to attach to the wafers stored in the substrate storing container.

Patent Document 1: PCT International Publication No. WO99/39994

DISCLOSURE OF THE INVENTION

Problems to be Solved by the Invention

In order to suppress particles or static electricity originating at the wafers occurring within the storage storing container or damage to the wafers, etc. during transport of the substrate storing container, it has been necessary to suppress the vibration which propagates from the wafer transport apparatus to the wafers stored in the substrate storing container.

It is an object of the present invention to provide a substrate storing container that can suppress the propagation of vibration to wafers stored in a substrate storing container by way of a simple structure.

Means for Solving the Problems

The present invention relates to a substrate storing container that stores substrates composed of semiconductor wafers, the substrate storing container including: a container main body including a tubular wall portion having a container main body opening portion formed at one end and the other end being closed, the wall portion including a back wall, an upper wall, a lower wall, and a pair of side walls, in which the container main body opening portion is formed by one end of the upper wall, one end of the lower wall, and one of the ends of the side walls, in which an inner face of the upper wall, an inner face of the lower wall, inner faces of the side walls, and an inner face of the back wall form a substrate storing space which can store a plurality of substrates and is in communication with the container main body opening; a lid body that can be removably attached to the container main body opening portion and can close the container main body opening portion; and a locked portion that is arranged at a center portion of the upper wall and is locked by a lifting member that can lift the container main body, in which the locked portion includes a plate-like flange portion having a lower face that faces the upper wall, and an elastically deformable elastic member provided at the lower face of the flange portion and/or at a rim portion of the flange portion, and in which the locked portion is locked by the lifting member in a state in which the elastic member is sandwiched between the flange portion and the lifting member.

Furthermore, it is preferable that an upper face of the elastic member has an engaging portion that can engage with a through-hole formed in the flange portion, and a lower face of the elastic member is configured by a flat face and the lifting member can abut the flat face.

Furthermore, it is preferable that an upper face of the elastic member has an engaging portion that can engage with a through-hole formed in the flange portion, and a lower face of the elastic member has a plurality of convex portions and the lifting member can abut the convex portions.

Furthermore, it is preferable that the engaging portion is configured by the elastic member which flowed into the through-hole by insert molding the elastic member having fluidity relative to the flange portion molded.

Furthermore, it is preferable that the flange portion has a convex portion at a rim, and a rim portion of the elastic member has a concave portion that can engage with the convex portion at the rim of the flange portion.

Furthermore, it is preferable to further include a rigid body having an upper face and a lower face, wherein the upper face of the rigid body is fixed to the lower face of the elastic member and the lower face of the rigid body can be abutted by the lifting member, in which the locked portion is locked to the lifting member in a state in which the lifting member does not abut the elastic member and the lifting member abuts the lower face of the rigid body, and the elastic member and the rigid member are sandwiched between the flange portion and the lifting member.

Effects of the Invention

According to the present invention, it is possible to provide a substrate storing container that can suppress the propagation of vibration to wafers stored in a substrate storing container by way of a simple structure.

PREFERRED MODE FOR CARRYING OUT THE INVENTION

Figure 1A:
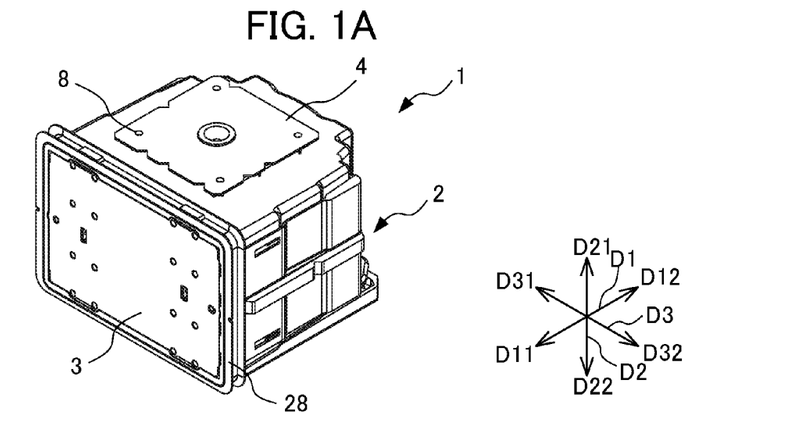
FIG. 1A is a perspective view illustrating a substrate storing container according to a first embodiment of the present invention.
Figure 1B:
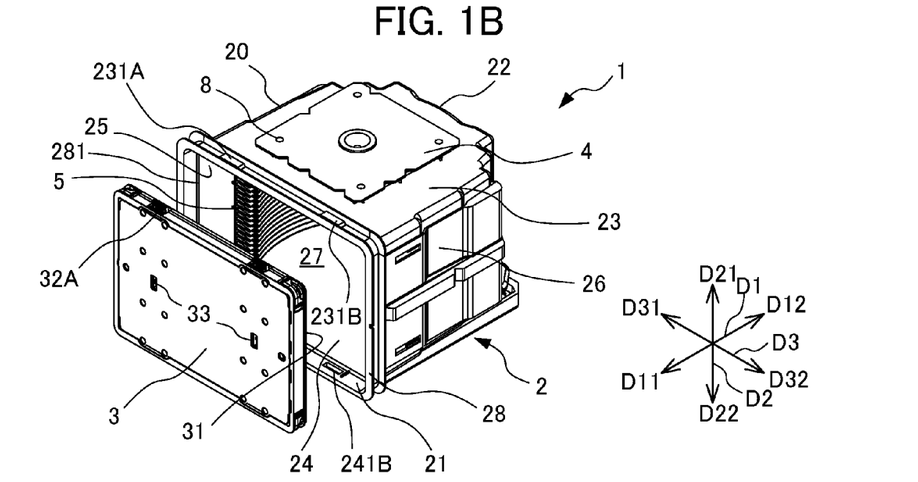
FIG. 1B is an exploded perspective view illustrating a substrate storing container according to the first embodiment of the present invention.
Figure 2:
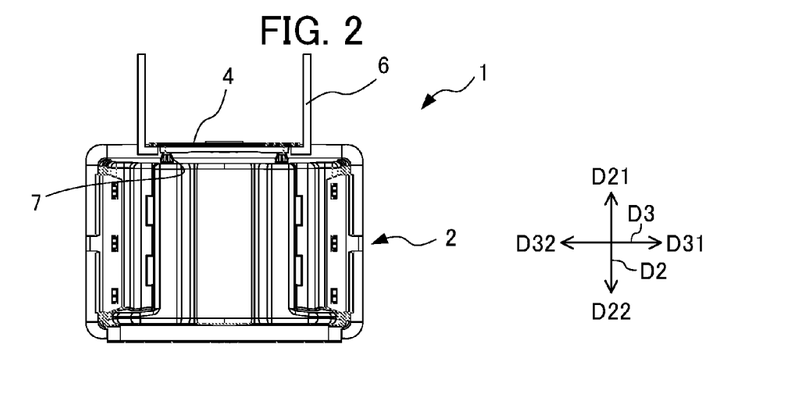
FIG. 2 is a back view illustrating a state in which a locked portion of the substrate storing container according to the first embodiment of the present invention is sandwiched by a lifting member.
Figure 3A:
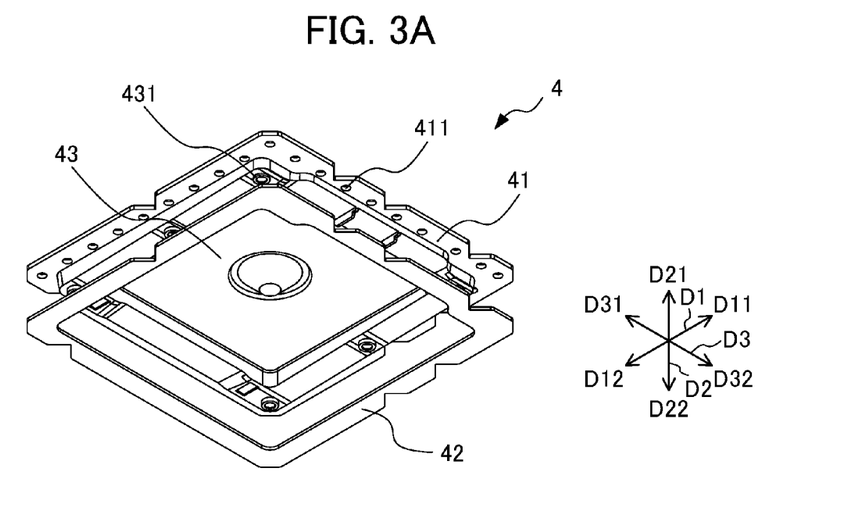
FIG. 3A is a perspective view illustrating a flange portion and an elastic member of the locked portion of the substrate storing container according to the first embodiment of the present invention.
Figure 3B:
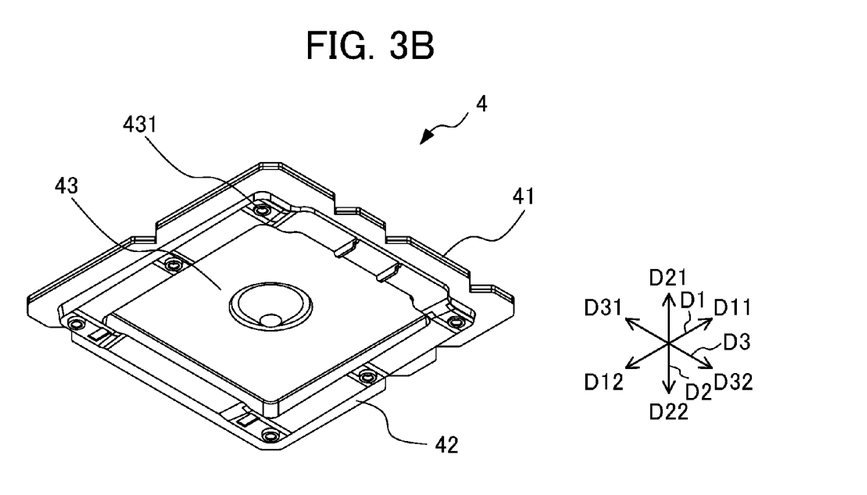
FIG. 3B is a perspective view illustrating a state in which the flange portion and the elastic member of the locked portion of the substrate storing container according to the first embodiment of the present invention are engaged.

In the following, a substrate storing container 1 according to the first embodiment of the present invention is described with reference to the drawings. FIG. 1A is a perspective view illustrating a substrate storing container according to a first embodiment of the present invention. FIG. 1B is an exploded perspective view illustrating a substrate storing container according to the first embodiment of the present invention; FIG. 2 is a back view illustrating a state in which a locked portion of the substrate storing container according to the first embodiment of the present invention is sandwiched by a lifting member. FIG. 3A is a perspective view illustrating a flange portion and an elastic member of the locked portion of the substrate storing container according to the first embodiment of the present invention. FIG. 3B is a perspective view illustrating a state in which the flange portion and the elastic member of the locked portion of the substrate storing container according to the first embodiment of the present invention are engaged.

Herein, for convenience of explanation, the direction from a container main body 2 toward a lid body 3 (described later) (lower left direction in FIG. 1B) is defined as a forward direction D11, and the direction opposite to the direction D11 is defined as a backward direction D12. Furthermore, these directions are defined as a forward/backward direction D1. In addition, the direction from a lower wall 24 to an upper wall 23 (described later) (upper direction in FIG. 1B) is defined as an upper direction D21, and the direction opposite to the direction D21 is defined as a lower direction D22. Furthermore, these directions are defined as an upper/lower direction D2. Moreover, the direction from a second side wall 26 to a first side wall 25 (described later) (upper left direction in FIG. 1B) is defined as a left direction D31, and the direction opposite to the direction D31 is defined as a right direction D32. Furthermore, these directions are defined as a left/right direction D3.

Furthermore, a substrate W (not illustrated) stored in a substrate storing container 1 is a disk-like silicon wafer, glass wafer, sapphire wafer, etc., and is a thin member used in industry. The substrate is a silicon wafer having a diameter of 450 mm.

As illustrated in FIGS. 1A and 1B, the substrate storing container 1 includes a container main body 2, a lid body 3, and a top flange 4 serving as a locked portion.

The container main body 2 has a tubular wall portion 20 with a container main body opening portion 21 formed at one end and the other end closed. A substrate storing space 27 is formed in the container main body 2. The substrate storing space 27 is formed to be surrounded by the wall portion 20. A substrate support plate-like portion 5 is disposed at a part of the wall portion 20 which forms the substrate storing space 27. A plurality of substrates can be stored in the substrate storing space 27.

The substrate support plate-like portion 5 is provided at the wall portion 20 so as to form a pair in the left/right direction D3 in the substrate storing space 27. When the container main body opening portion 21 is not closed by the lid body 3, the substrate support plate-like portion 5 can support the edge portions of the plurality of substrates in a state in which adjacent substrates are arranged in parallel to be spaced apart by a predetermined interval. The back-side support plate-like portion (not illustrated) is provided at the back side of the substrate support plate-like portion 5. When the container main body opening portion 21 is closed by the lid body 3, the back-side substrate support portion (not illustrated) can support rear portions of the edge portions of the plurality of substrates.

The lid body 3 can be removably attached to the container main body opening portion 21 and can close the container main body opening portion 21. A front retainer (not illustrated) is provided at a part of the lid body 3 (a back side face of the lid body 3 illustrated in FIG. 1), which faces the substrate storing space 27 when the container main body opening portion 21 is closed by the lid body 3. The front retainer (not illustrated) is provided so as to form a pair with the back-side substrate support portion (not illustrated).

When the container main body opening portion 21 is closed by the lid body 3, the front retainer (not illustrated) can support front parts of the edge portions of the plurality of substrates. When the container main body opening portion 21 is closed by the lid body 3, the front retainer (not illustrated) retains the plurality of substrates in a state in which adjacent substrates are arranged in parallel to be spaced apart by a predetermined interval by supporting the plurality of substrates in cooperation with the back-side substrate support portion (not illustrated). In the following, each portion will be described in detail.

As illustrated in FIGS. 1A and 1B, the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are made of a plastic material, etc., and are configured so as to be integrally molded with polycarbonate in the first embodiment.

The first side wall 25 faces the second side wall 26 and the upper wall 23 faces the lower wall 24. A rear end of the upper wall 23, a rear end of the lower wall 24, a rear end of the first side wall 25, and a rear end of the second side wall 26 are all connected to the back wall 22. A front end of the upper wall 23, a front end of the lower wall 24, a front end of the first side wall 25, and a front end of the second side wall 26 have a positional relationship opposite the back wall 22, and configure an opening rim portion 28 which forms the container main body opening 21 in a substantially rectangular shape.

The opening rim portion 28 is provided at one end of the container main body 2, and the back wall 22 is located at the other end of the container main body 2. The profile of the container main body 2 formed by the outer faces of the wall portion 20 is a box shape. Inner faces of the wall portion 20, i.e. an inner face of the back wall 22, an inner face of the upper wall 23, an inner face of the lower wall 24, an inner face of the first side wall 25, and an inner face of the second side wall 26, form the substrate storing space 27, which is surrounded by these. The container main body opening portion 21 formed by the opening rim portion 28 is surrounded by the wall portion 20 and is in communication with the substrate storing space 27 formed inside the container main body 2. The substrate storing space 27 can store a maximum of twenty-five substrates W in a positional relationship in which an upper face and a lower face of a substrate are substantially horizontal.

As illustrated in FIG. 1B, latch engagement concave portions 231A, 231B, 241B, and a latch engagement concave portion (not illustrated), which are concave outwardly from the substrate storing space 27, are formed at portions of the upper wall 23 and the lower wall 24 which are proximal to the opening rim portion 28. Each of the latch engagement concave portions 231A, 231B, 241B, and the latch engagement concave portion (not illustrated) is respectively formed in the vicinities of both right and left ends of the upper wall 23 and the lower wall 24 in the total amount of four.

As illustrated in FIG. 2, a plurality of flange fixing portions 7 is provided so as to be integrally formed with the upper wall 23 at an outer face of the upper wall 23. The plurality of flange fixing portions 7 is disposed at the center portion of the upper wall 23.

As illustrated in FIG. 3A, the top flange 4 as a locked portion includes a flange portion 41, an elastic member 42, and a top flange base portion 43 and is fixed to a flange fixing portion 7 by way of screws 8, as illustrated in FIGS. 1A and 1B.

The top flange base portion 43 is formed of a thermoplastic material such as polycarbonate and has a substantially quadrilateral shape when viewed in the upper direction D21. As illustrated in FIGS. 3A and 3B, the top flange base portion 43 is provided with a plurality of fixing holes 431. The fixing hole 431 has a columnar shape and extends through the tip flange base portion 43 in the upper/lower direction. Furthermore, the fixing holes 431 have a positional relationship facing a plurality of flange fixing portions 7 of the upper wall 23 in the lower direction D22 of the top flange base portion 43.

The flange portion 41 is made of a thermoplastic material such as polycarbonate, integrally formed with the top flange base portion 43, and has a plate shape having a thickness of 4 mm with a lower face facing the upper wall 23. The flange portion 41 is located at a position having a predetermined step difference in the upper direction with respect to an upper face of the top flange base portion 43, and is formed to surround a rim of the top flange base portion 43 with a predetermined width. As illustrated in FIG. 3A, a plurality of engaging holes 411 are formed in the flange portion 41. The engaging hole 411 has a columnar shape and is configured by a through-hole that extends through the flange portion 41 in the upper/lower direction.

Figure 7:
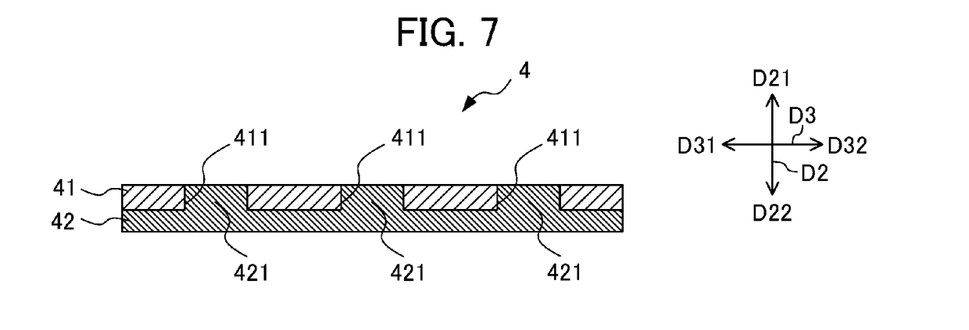
FIG. 7 is a cross-sectional view illustrating an engagement between an elastic member and a flange portion of a locked portion of a substrate storing container according to the first to fourth embodiments of the present invention.

The elastic member 42 is configured by an elastomer having a thickness of 3.5 mm and is elastically deformable. As illustrated in FIG. 3A, the elastic member 42 has a shape in which the profile corresponds to that of the flange portion 41. The elastic member 42 is provided so as to cover a lower face of the flange portion 41. As illustrated in FIG. 7, an upper face of the elastic member 42 has a plurality of a convex-shape engaging portions 421 having a shape corresponding to the engaging hole 411. The engaging portion 421 has a positional relationship facing the engaging hole 411 of the flange portion 41 in the upper direction of the elastic member 42. The engaging portion 421 can engage with the engaging hole 411 from a lower face side of the flange portion 41.

The plurality of engaging portions 421 provided at an upper face of the elastic member 42 engages with the plurality of engaging holes 411 provided at the flange portion 41 from the lower face side of the flange portion 41. With such a configuration, the flange portion 41 engages with the elastic member 42 to assemble the top flange 4. As illustrated in FIGS. 1A and 1B, the top flange 4 is fixed to the flange fixing portion 7 located in the lower direction D22 of the top flange base portion 43 by being threaded with the screws 8 which are inserted into the fixing holes 431 (not illustrated) of the top flange base portion 43. With such a configuration, the top flange 4 is fixed at an outer face of the upper wall 23 of the container main body 2. The lower face of the elastic member 42 is configured by a flat face.

The top flange 4 serving as a locked portion is locked by an arm 6 serving as a lifting member that can lift the container main body 2. Furthermore, a flat face constituting the lower face of the elastic member 42 can abut the arm 6 serving as a lifting member. More specifically, as illustrated in FIG. 2, the top flange 4 is hung to the mechanical arm 6 serving as a lifting member from the left/right direction D3, when suspending the substrate storing container 1 by AMHS (Automated Material Handling System), PGV (Person Guided Vehicle), etc., whereby the substrate storing container 1 is suspended by the arm 6. At this moment, the elastic member 42 of the top flange 4 abuts the arm 6, and the top flange 4 is locked by the arm 6 of the wafer transport apparatus serving as a lifting member in a state in which the elastic member 42 is held between, i.e. sandwiched between, the flange portion 41 and the arm 6 of the wafer transport apparatus serving as a lifting member. It should be noted that the top flange 4 may be hung to these mechanical arms 6 as a lifting member in the forward/backward direction D1.

As illustrated in FIG. 1B, the lid body 3 has a substantially rectangular shape which substantially corresponds to the shape of the opening rim portion 28 of the container main body 2. The lid body 3 is detachable relative to the opening rim portion 28 of the container main body 2, and the container main body opening portion 21 can be closed by the lid body 3 by the lid body 3 being attached to the opening rim portion 28. A ring-like sealing member 31 is attached to a face which is an inner face of the lid body 3 (a back side face of the lid body 3 illustrated in FIG. 1B) and faces a face (a sealing face 281) of a part of the step difference formed at a location immediately in the backward direction D12 from the opening rim portion 28 when the lid body 3 closes the container main body opening portion 21. The sealing member 31 is made of various thermoplastic elastomers such as elastically deformable polyesters and polyolefins; fluorine-containing rubber; silicone rubber; etc. The sealing member 31 is arranged so as to go around an outer rim portion of the lid body 3.

When the lid body 3 is attached to the opening rim portion 28, the outer rim portion of the lid body 3 abuts an inner rim portion of the opening rim portion 28 of the container main body 2 through the sealing member 31. With such a configuration, the sealing member 31 is elastically deformed by being sandwiched between the outer rim portion of the lid body 3 and the inner rim portion of the opening rim portion 28, and thus the lid body 3 closes the container main body opening portion 21 in a sealed state. By the lid body 3 being removed from the opening rim portion 28, it becomes possible to load or unload the substrates relative to the substrate storing space 27 in the container main body 2.

A latch mechanism is provided at the lid body 3. The latch mechanism is provided in the vicinity of both left and right ends of the lid body 3. As illustrated in FIG. 1B, the latch mechanism includes two upper side latch portions 32A that can project from an upper side of the lid body 3 in the upper direction D21 and two lower latch portions (not illustrated) that can project from a lower side of the lid body 3 in the lower direction D22. The two upper latch portions 32A are arranged in the vicinity of both left and right ends of the upper side of the lid body 3, and the two lower latch portions are arranged in the vicinity of the left and right ends of the lower side of the lid body 3.

An operation portion 33 is provided at an outer face of the lid body 3. By operating the operation portion 33 from the front side of the lid body 3, it is possible to cause the upper side latch portion 32A and the lower side latch portion (not illustrated) to project from the upper side and the lower side of the lid body 3, as well as possible to make a state not projecting from the upper side and the lower side of the lid body 3. By the upper side latch portions 32A projecting from the upper side of the lid body 3 in the upper direction D21 to engage with the latch engagement concave portions 231A and 231B of the container main body 2 and the lower side latch portion projecting from the lower side of the lid body 3 in the lower direction D22 to engage with the latch engagement concave portion (not illustrated) and the latch engagement concave portion 241B of the container main body 2, the lid body 3 is fixed to the opening rim portion 28 of the container main body 2.

A concave portion (not illustrated), which is concave outwardly from the substrate storing space 27, is formed inside of the lid body 3 at the lid body 3. The concave portion is formed at a center location in the left/right direction D3 of the lid body 3. At the inner face of the lid body 3 at which the concave portion is formed, a pair of front retainer locking portions (not illustrated) is provided in the left/right direction D3.

In accordance with the substrate storing container 1 according to the present embodiment 1 with the abovementioned configuration, the following effect can be obtained.

A substrate storing container 1 that stores substrates composed of semiconductor wafers includes: a container main body 2 including a tubular wall portion 20 having a container main body opening portion 21 formed at one end and the other end being closed, the wall portion 20 including a back wall 22, an upper wall 23, a lower wall 24, and the first side wall 25 and the second side wall 26 as a pair of side walls, at which the container main body opening portion 21 is formed by one end of the upper wall 23, one end of the lower wall 24, and one end of the first side wall 25 and one end of the second side wall 26 as a pair of the side walls, in which an inner face of the upper wall 23, an inner face of the lower wall 24, inner faces of the first side wall 25 and the second side wall 26 as the side walls, and an inner face of the back wall 22 form a substrate storing space 27 which can store a plurality of substrates and is in communication with the container main body opening 21; a lid body 3 that can be removably attached to the container main body opening portion 21 and can close the container main body opening portion 21; and a top flange 4 as a locked portion that is arranged at a center portion of the upper wall 23 and is locked by an arm 6 as a lifting member that can lift the container main body 2, in which the top flange 4 as the locked portion includes a plate-like flange portion 41 having a lower face that faces the upper wall 23, and an elastically deformable elastic member 42 provided so as to cover the lower face of the flange portion 41, and in which the top flange 4 as the locked portion is locked by the arm 6 of a wafer transport apparatus as the lifting member in a state in which the elastic member 42 is sandwiched between the flange portion 41 and the arm 6 of the wafer transport apparatus as the lifting member.

With such a configuration, the substrate storing container 1 is lifted and transported in a state in which the arm 6 of the wafer transport apparatus abuts the elastic member 42 provided at a rim portion of a lower face of the top flange 4. At this moment, the vibration occurring at the wafer transport apparatus propagates to the top flange 4 through the arm 6. However, the vibration propagated to the top flange 4 is absorbed by the elastic member 42 provided at the rim portion of the lower face of the top flange 4. Therefore, it is possible to suppress the vibration occurring at the wafer transport apparatus from propagating to the substrate storing container 1, and thus suppress the vibration of substrates stored in the substrate storing container 1. As a result thereof, inside the substrate storing container 1, it is possible to reduce friction between wafers and grooved plates retaining the wafers, and thus suppress particles or static electricity originated at the wafers occurring within the storage storing container or damage to the wafers, etc. during transport of the substrate storing container 1. The elastic member 42 provided at the lower face of the flange portion 41 reduces stress due to the vibration occurring intensively at a joining portion of the top flange 4 and the container main body 2.

Furthermore, the upper face of the elastic member 42 includes engaging portions 421 which can engage with the engaging holes 411 as through-holes formed in the flange portion 41, and the lower face of the elastic member 42 is configured by a flat face at which the arm 6 as a lifting member can abut.

With such a configuration, it is possible to attach the elastic member 42 to the flange portion 41 easily and to suppress the propagation of vibration to the wafers stored in the substrate storing container 1 with a simple structure.

Figure 4A:
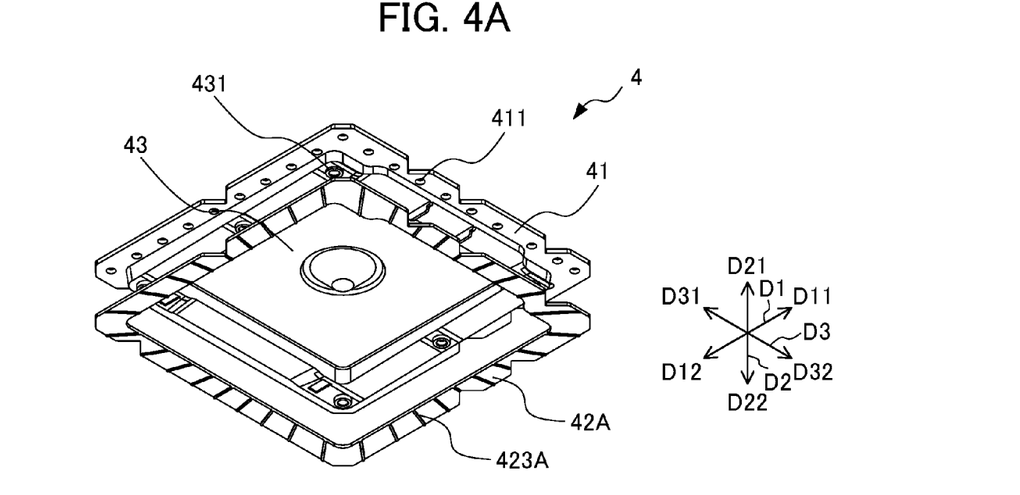
FIG. 4A is a perspective view illustrating a flange portion and an elastic member of a substrate storing container according to the second embodiment of the present invention.
Figure 4B:
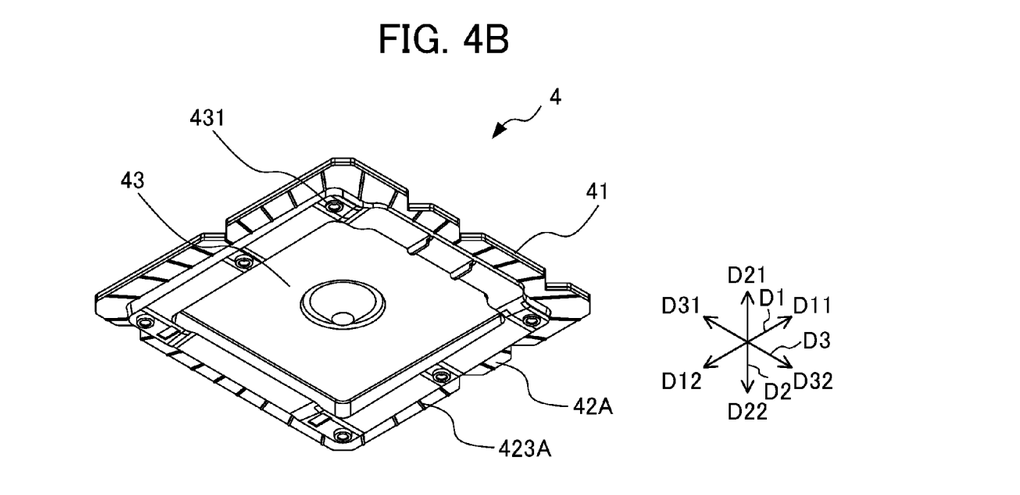
FIG. 4B is a perspective view illustrating a state in which the flange portion and the elastic member of the substrate storing container according to the second embodiment of the present invention are engaged.

In the following, a substrate storing container 1 according to a second embodiment of the present invention will be described with reference to the drawings. FIG. 4A is a perspective view illustrating a flange portion 41 and an elastic member 42A of a substrate storing container 1 according to the second embodiment of the present invention. FIG. 4B is a perspective view illustrating a state in which the flange portion 41 and the elastic member 42A of the substrate storing container 1 according to the second embodiment of the present invention are engaged.

As illustrated in FIGS. 4A and 4B, the second embodiment differs from the first embodiment in the point of a lower face of the elastic member 42A having a plurality of convex portions 423A in a linear shape which are formed radially from the center of the lower face of the elastic member 42A. Since the configurations of the second embodiment other than the abovementioned configuration are the same as those of the first embodiment, the same reference numerals are used for illustration of the same members, and explanations will be omitted.

As illustrated in FIGS. 4A and 4B, in the second embodiment, the lower face of the elastic member 42A has a plurality of convex portions 423A in a linear shape which are formed radially from the center of the lower face of the elastic member 42A, and the arm 6 of the wafer transport apparatus serving as a lifting member can abut the convex portions 423A.

When transporting the substrate storing container 1, the arm 6 of the wafer transport apparatus abuts a plurality of convex portions 423A in a linear shape provided at the lower face of the elastic member 42A of the top flange 4. The plurality of convex portions 423A which abuts the arm 6 has an effect of preventing slipping relative to the arm 6 of the wafer transport apparatus. With such a configuration, when transporting the substrate storing container 1, the arm 6 of the wafer transport apparatus can sandwich the substrate storing container 1 in a state that does not easily slip in the forward/backward direction D1 and the left/right direction D3. Furthermore, the elastic member 42A absorbs the vibration which propagates from the arm 6 of the wafer transport apparatus to the substrate storing container 1 by the plurality of convex portions 423A in a linear shape provided at the lower face.

Figure 5:
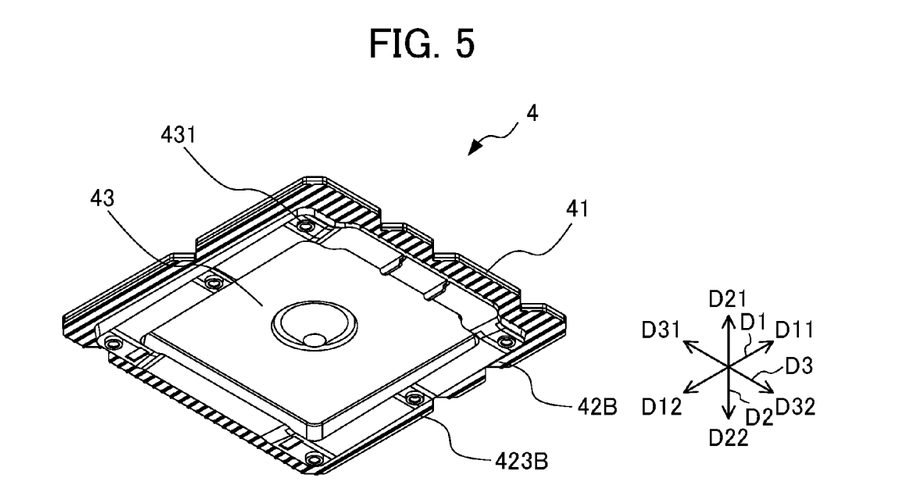
FIG. 5 is a perspective view illustrating a state in which a flange portion and an elastic member of a substrate storing container according to the third embodiment of the present invention are engaged.

In the following, a substrate storing container 1 according to a third embodiment of the present invention will be described with reference to the drawings. FIG. 5 is a perspective view illustrating a state in which a flange portion 41 and an elastic member 42B of a substrate storing container 1 according to the third embodiment of the present invention are engaged.

As illustrated in FIG. 5, the third embodiment differs from the first embodiment in the point in which a lower face of the elastic member 42B includes a plurality of convex portions 423B in a linear shape that extend in parallel in the forward/backward direction D1. Since the configurations of the third embodiment other than the abovementioned configuration are the same as those of the first embodiment, the same reference numerals are used for illustration of the same members, and explanations will be omitted.

In the third embodiment, as illustrated in FIG. 5, the lower face of the elastic member 42B includes a plurality of convex portions 423B in a linear shape which extend in parallel in the forward/backward direction D1, and the arm 6 of the wafer transport apparatus serving as a lifting member can abut the convex portions 423B.

With such a configuration, when transporting the substrate storing container 1, the arm 6 of the wafer transport apparatus abuts the plurality of convex portions 423B in a linear shape that extends in parallel in the forward/backward direction D1 provided at the lower face of the elastic member 42B of the top flange 4. The plurality of convex portions 423B which abuts the arm 6 has an effect of preventing slipping relative to the arm 6 of the wafer transport apparatus. With such a configuration, when transporting the substrate storing container 1, the arm 6 of the wafer transport apparatus can sandwich the substrate storing container 1 in a state that does not easily slip in the forward/backward direction D1 and the left/right direction D3. Furthermore, the elastic member 42B absorbs the vibration which propagates from the arm 6 of the wafer transport apparatus to the substrate storing container 1 by the plurality of convex portions 423B in a linear shape provided at the lower face.

Figure 6:
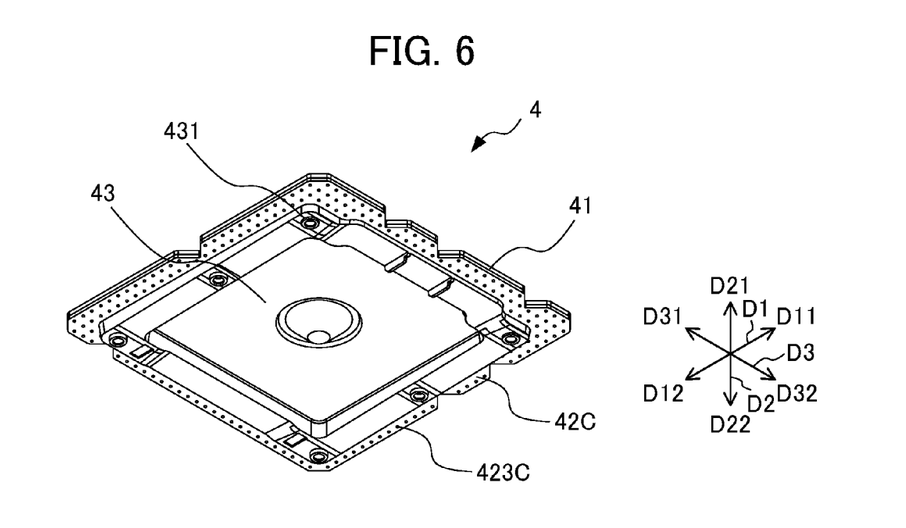
FIG. 6 is a perspective view illustrating a state in which a flange portion and an elastic member of a substrate storing container according to the fourth embodiment of the present invention are engaged.

In the following, a substrate storing container 1 according to a fourth embodiment of the present invention will be described with reference to the drawings. FIG. 6 is a perspective view illustrating a state in which a flange portion 41 and an elastic member 42C of a substrate storing container 1 according to the fourth embodiment of the present invention are engaged.

As illustrated in FIG. 6, the fourth embodiment differs from the first embodiment in the point of a lower face of the elastic member 42C including a plurality of convex portions 423C in a semi-spherical shape that projects in the lower direction D22. Since the configurations of the fourth embodiment other than the abovementioned configuration are the same as these of the first embodiment, the same reference numerals are used for illustration of the same members, and explanations will be omitted.

In the fourth embodiment, as illustrated in FIG. 6, the lower face of the elastic member 42C includes a plurality of convex portions 423C in a semi-spherical shape which projects in the lower direction D22, and the arm 6 of the wafer transport apparatus serving as a lifting member can abut the convex portions 423C.

With such a configuration, when transporting the substrate storing container 1, the arm 6 of the wafer transport apparatus abuts the plurality of convex portions 423C in a semi-spherical shape that projects in the lower direction D22 provided at the lower face of the elastic member 42C of the top flange 4. The plurality of convex portions 423C which abuts the arm 6 has an effect of preventing slipping to the arm 6 of the wafer transport apparatus. With such a configuration, when transporting the substrate storing container 1, the arm 6 of the wafer transport apparatus can sandwich the substrate storing container 1 in a state that does not easily slip in the forward/backward direction D1 and the left/right direction D3. Furthermore, the elastic member 42C absorbs the vibration which propagates from the arm 6 of the wafer transport apparatus to the substrate storing container 1 by the plurality of convex portions 423C in a semi-spherical shape provided at the lower face.

Figure 8:
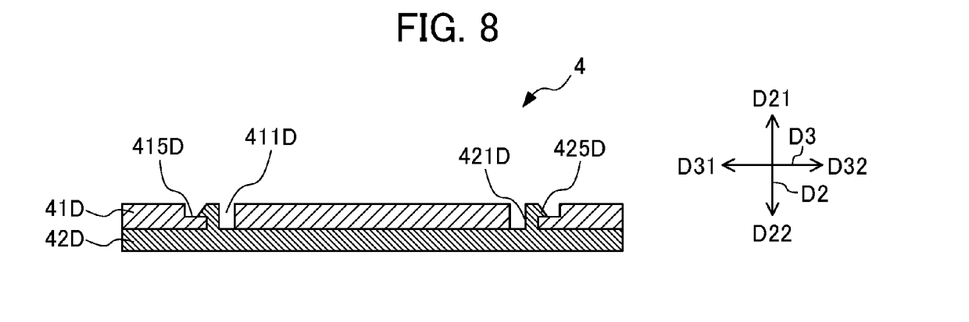
FIG. 8 is a cross-sectional view illustrating an engagement between a flange portion and an elastic member of a substrate storing container according to the fifth embodiment of the present invention.

In the following, a substrate storing container 1 according to a fifth embodiment of the present invention will be described with reference to the drawings. FIG. 8 is a cross-sectional view illustrating an engagement between a flange portion 41D and an elastic member 42D of a substrate storing container 1 according to the fifth embodiment of the present invention.

As illustrated in FIG. 8, the fifth embodiment differs from the first embodiment in the point of engaging portions 421D of an elastic member 42D having a hook shape and engaging holes 411D of a flange portion 41D having a step structure. Since the configurations of the fifth embodiment other than the abovementioned configuration are the same as these of the first embodiment, the same reference numerals are used for illustration of the same members, and explanations will be omitted.

In the fifth embodiment, as illustrated in FIG. 8, an upper face of an elastic member 42D has a plurality of engaging portions 421D at which a hook-shape portion 425D is provided at an upper part thereof. A plurality of engaging holes 411D as through-holes is provided in the flange portion 41D. A side wall forming the engaging hole 411D has a step structure including a step difference portion 415D. The hook-shape portion 425D of the elastic member 42D is locked by the step difference portion 415D of the flange portion 41D. With such a configuration, the elastic member 42D engages with the flange portion 41D.

With such a configuration, the elastic member 42D can be easily attached to the flange portion 41D, and it is possible to suppress the propagation of the vibration to the wafers stored in the substrate storing container 1 by the top flange 4 with a simple structure having the hook-shape portion 425D and the step difference portion 415D.

Figure 9:
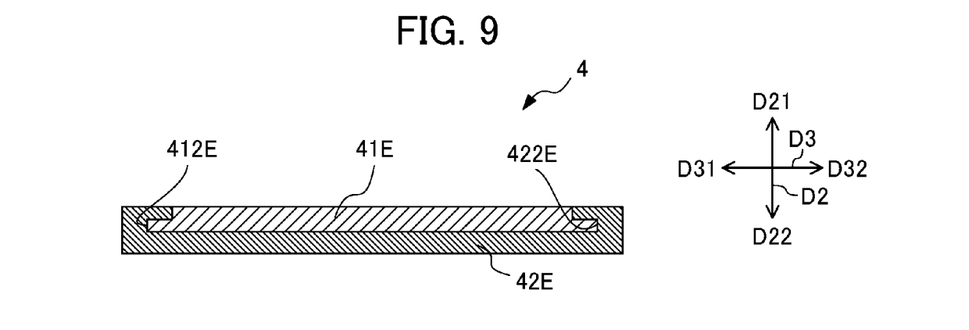
FIG. 9 is a cross-sectional view illustrating an engagement between a flange portion and an elastic member of a substrate storing container according to the sixth embodiment of the present invention.

In the following, a substrate storing container 1 according to a sixth embodiment of the present invention will be described with reference to the drawings. FIG. 9 is a cross-sectional view illustrating an engagement between a flange portion 41E and an elastic member 42E of a substrate storing container 1 according to the sixth embodiment of the present invention.

As illustrated in FIG. 9, the sixth embodiment differs from the first embodiment in the point of the top flange 4 as a locked portion including a lower face of the flange portion 41E and an elastically deformable elastic member 42E which is provided so as to cover a rim portion of the flange portion 41E. Since the configurations of the sixth embodiment other than the abovementioned configuration are the same as these of the first embodiment, the same reference numerals are used for illustration of the same members, and explanations will be omitted.

As illustrated in FIG. 9, in the sixth embodiment, a rim of the elastic member 42E includes an engaging concave portion 422E as a concave portion formed in a U-shape and the flange portion 41E includes an engaging convex portion 412E as a convex portion at a rim. The engaging concave portion 422E of the elastic member 42E is engaged with the engaging convex portion 412E of the flange portion 41E.

With such a configuration, the elastic member 42E can be easily attached to the flange portion 41E, and it is possible to suppress the propagation of the vibration to the wafers stored in the substrate storing container 1 with the top flange 4 includes a simple structure by way of the engaging concave portion 422E and the engaging convex portion 412E.

Figure 10:
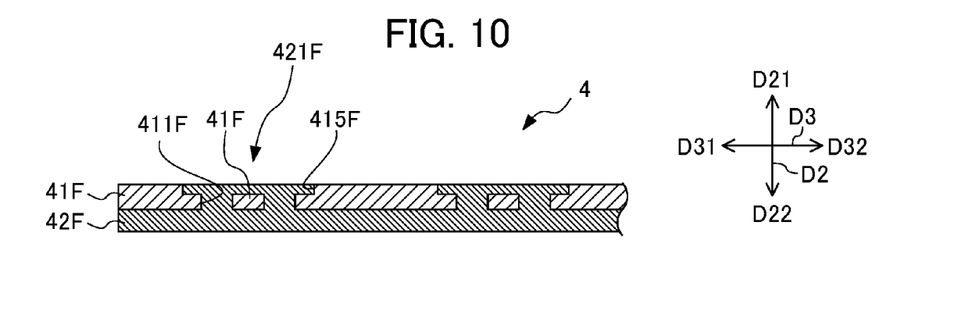
FIG. 10 is a cross-sectional view illustrating an engagement between a flange portion and an elastic member of a substrate storing container according to the seventh embodiment of the present invention.

In the following, a substrate storing container 1 according to a seventh embodiment of the present invention will be described with reference to the drawings. FIG. 10 is a cross-sectional view illustrating an engagement between a flange portion 41F and an elastic member 42F of a substrate storing container 1 according to the seventh embodiment of the present invention.

As illustrated in FIG. 10, the seventh embodiment differs from the first, second, and fourth embodiment in the point of the engaging portion 421F of the elastic member 42F being configured by the elastic member 42F which flows into the engaging hole 411F of the flange portion 41F by insert molding the elastic member 42F having fluidity relative to a molded flange portion 41F. Since the configurations of the seventh embodiment other than the abovementioned configuration are the same as these of the first embodiment, the second embodiment, and the fourth embodiment, the same reference numerals are used for illustration of the same members, and explanations will be omitted.

As illustrated in FIG. 10, in the seventh embodiment, the flange portion 41F includes engaging holes 411F as two through-holes which are arranged so as to be aligned at a predetermined interval in the left/right direction D3 in the vicinity of the left end in the left/right direction D3. Furthermore, the flange portion 41F has a predetermined step difference in the lower direction D22 with respect to an upper face of the flange portion 41F in the vicinity of the left end in the left/right direction D3, and has a step difference portion 415F provided at a position surrounding the two engaging holes 411F. The two engaging holes 411F are in communication with the step difference portion 415F. A plurality of the engaging holes 411F and the step difference portions 415F of the flange portion 41F molded as above are provided in the vicinity of a front end, a rear end, a left end, and a right end of the flange portion 41F, respectively. By the elastic member 42F having fluidity being insert molded to the engaging holes 411F and the step difference 415F, the engaging portion 421F of the elastic member 42F is configured by the elastic member 42F which flows into the engaging holes 411F of the flange portion 41F. With such a configuration, the elastic member 42F is engaged with the flange portion 41F. The upper face of the elastic member 42F which flows into the step difference portion 415F is flush with the upper face of the flange portion 41.

According to such insert molding, the elastic member 42F is not likely to be removed from the flange portion 41F, whereby it is possible to reduce trouble during transport of the substrate storing container 1 of a wafer transport apparatus due to detachment of the elastic member 42F.

Figure 11A:
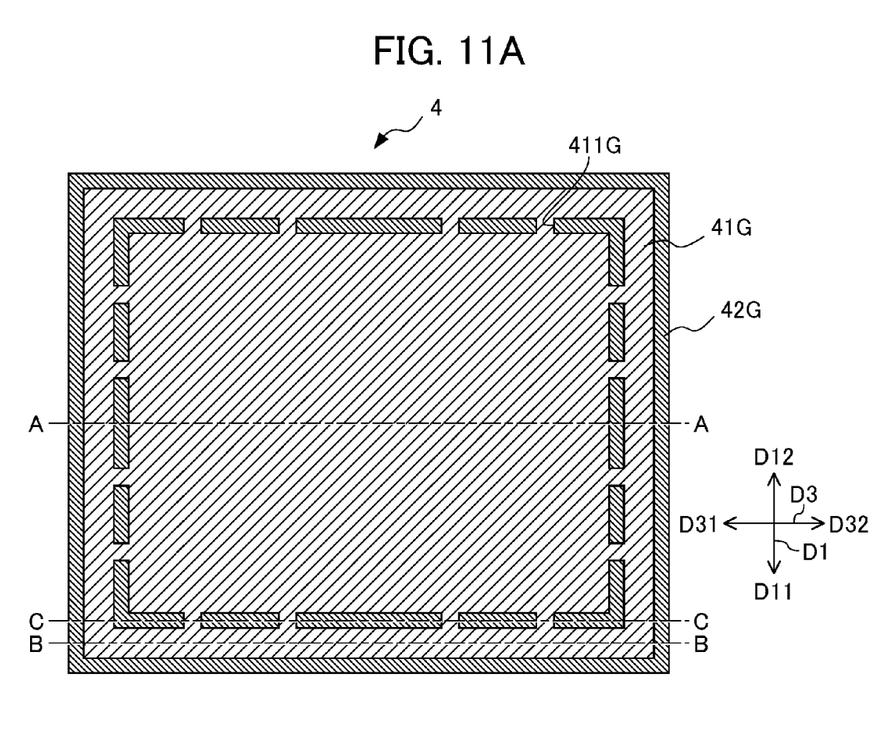
FIG. 11A is a plan cross-sectional schematic view illustrating an engagement between a flange portion 41G and an elastic member 42G of a substrate storing container according to the eighth embodiment of the present invention.
Figure 11B:
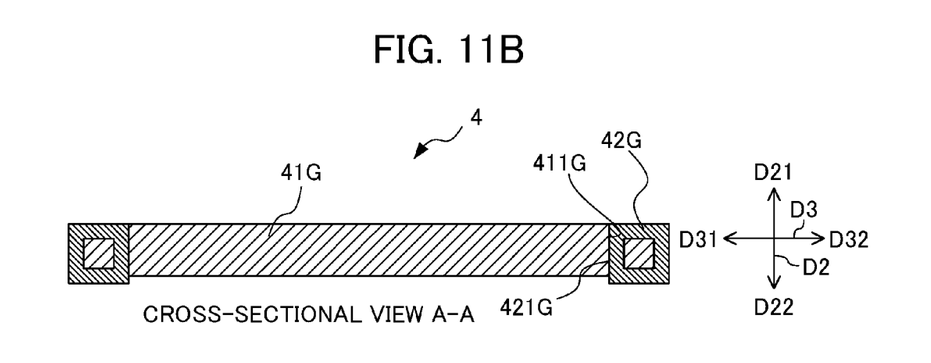
FIG. 11B is a cross-sectional view along the line A-A of FIG. 11A.
Figure 11C:
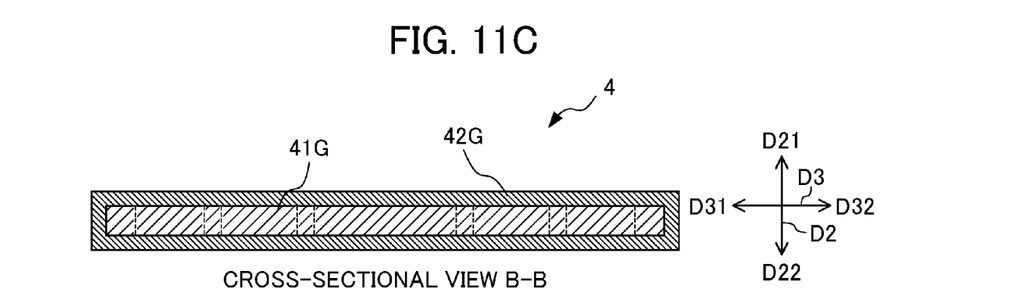
FIG. 11C is a cross-sectional view along the line B-B of FIG. 11A.
Figure 11D:
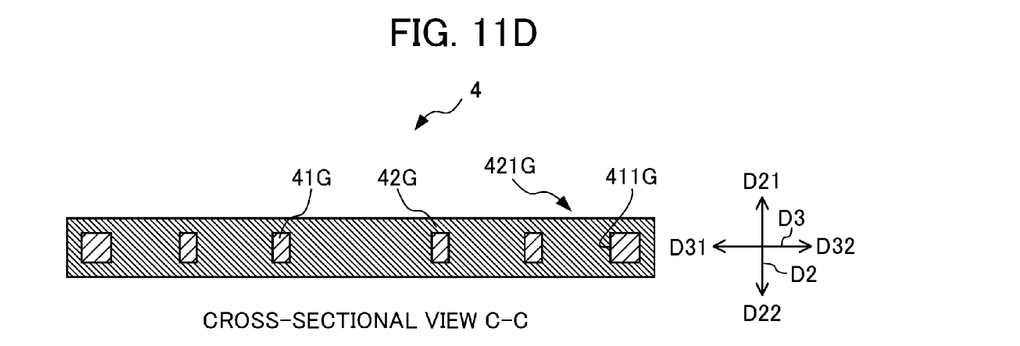
FIG. 11D is a cross-sectional view along the line C-C of FIG. 11A.

In the following, a substrate storing container 1 according to an eighth embodiment of the present invention will be described with reference to the drawings. FIG. 11A is a plan cross-sectional schematic view illustrating an engagement between a flange portion 41G and an elastic member 42G of a substrate storing container 1 according to the eighth embodiment of the present invention. FIG. 11B is a cross-sectional view along the line A-A of FIG. 11A. FIG. 11C is a cross-sectional view along the line B-B of FIG. 11A. FIG. 11D is a cross-sectional view along the line C-C of FIG. 11A. It should be noted that, in FIG. 11B, the illustration of the details for the center part is omitted for convenience.

As illustrated in FIG. 11D, the eighth embodiment differs from the first, second, and fourth embodiment in the point of an engaging portion 421G of an elastic member 42G being configured by an elastic member 42G which flows into an engaging hole 411G of the flange portion 41G by insert molding the elastic member 42G having fluidity relative to the molded flange portion 41G. Furthermore, the shapes of the engaging hole 411G and the engaging portion 421G differ from the shapes of the engaging hole 411F and the engaging portion 421F of the seventh embodiment.

As illustrated in FIG. 11D, in the eighth embodiment, the flange portion 41G includes a plurality of the engaging holes 411G that is arranged at locations having a predetermined distance from a rim so as to extend along the rim in the vicinity of a rim edge and that extend through the flange portion 41G in the upper/lower direction D2. A front side end, a rear side end, a right side end, and a left side end of the flange portion 41G which are closer to a rim of the flange portion 41G than that of the engaging hole 411G are thinner than the other portions of the flange portion 41G in terms of the thickness in the upper/lower direction. The engaging portion 421G of the elastic member 42G is configured by the elastic member 42G which flows into the engaging hole 411G of the flange portion 41G by insert molding the elastic member 42G having fluidity relative to the engaging hole 411G of the flange portion 41G molded as above. With such a configuration, the elastic member 42G is engaged with the flange portion 41G. In other words, the elastic member 42G is provided so as to cover the upper face and the lower face of the flange portion 41G and a rim portion of the flange portion 41G. The elastic member 42G is formed so as to be flush with the flange portion 41G at the upper face of the top flange 4. Furthermore, as illustrated in FIG. 11B, at the lower face of the top flange 4, the elastic member 42G is formed so as to project in the lower direction D22 more than the lower face of the flange portion 41G.

With such insert molding, the elastic member 42G is engaged rigidly to the flange portion 41G, and thus the elastic member 42G is not likely to be removed from the flange portion 41G, whereby it is possible to reduce trouble during transport of the substrate storing container of a wafer transport apparatus 1 due to the detachment of the elastic member 42G.

Figure 12:
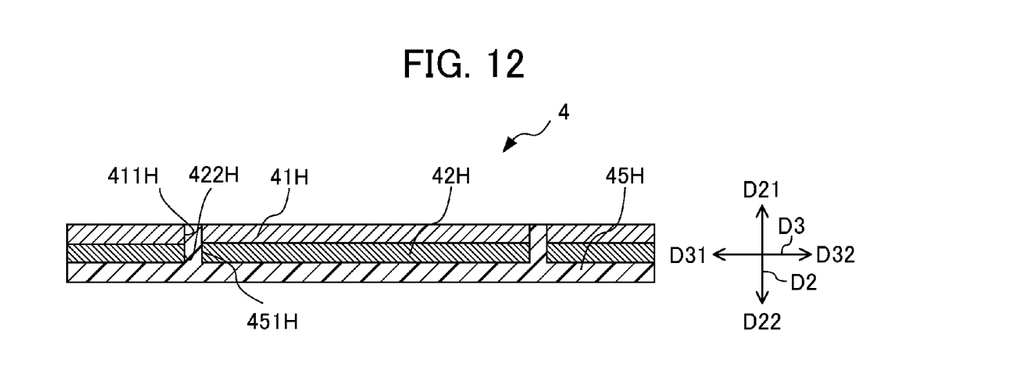
FIG. 12 is a cross-sectional view illustrating a flange portion 41H, an elastic member 42H, and a rigid body 45H of a locked portion of a substrate storing container according to the ninth embodiment of the present invention.

In the following, a substrate storing container 1 according to a ninth embodiment of the present invention will be described with reference to the drawings. FIG. 12 is a cross-sectional view illustrating a flange portion 41H, an elastic member 42H, and a rigid body 45H of a substrate storing container 1 according to the ninth embodiment of the present invention.

As illustrated in FIG. 12, the ninth embodiment differs from the first embodiment in the point of the top flange 4 serving as a locked portion including a rigid body 45H having an upper face and a lower face. Since the configurations of the ninth embodiment other than the abovementioned configuration are the same as these of the first embodiment, the same reference numerals are used for illustration of the same members, and explanations will be omitted.

As illustrated in FIG. 12, in the ninth embodiment, a plurality of engaging portions 451H is provided at an upper face of the rigid body 45H. Pluralities of engaging holes 422H and engaging holes 411H which extend through elastic members 42H and flange portions 41H, respectively, are provided at a part of the elastic member 42H and a part of the flange portion 41H which face the engaging portion 451H of the rigid body 45H. The rigid body 45H is attached to the top flange 4 serving as a locked portion by the engaging portion 451H being engaged with the engaging hole 422H and the engaging hole 411H from the lower face side of the elastic member 42H and the flange portion 41H, and the upper face of the rigid body 45H is fixed to the lower face of the elastic member 42H.

With such a configuration, since the substrate storing container 1 is transported by being lifted by the arm 6 of the wafer transport apparatus in a state in which the arm 6 of the wafer transport apparatus does not abut the elastic member 42H, but rather abuts the rigid body 45H which is fixed to the lower face of the elastic member 42H as well as in a state in which the elastic member 42H and the rigid body 45H are sandwiched between the flange portion 41H and the arm 6 of the wafer transport apparatus, it is possible to prevent particles generated from the friction between the arm 6 of the wafer transport apparatus and the elastic member 42H.

The present invention is not limited to the abovementioned embodiments, and modifications thereto within the technical scope claimed in the claims are possible. For example, in the first to fourth embodiments, although the elastic member is attached to the flange portion by the engaging member provided at the upper face of the elastic member being engaged with the engaging hole of the flange portion from the lower face of the flange portion, the engaging portion of the elastic member may be configured to be insert molded with respect to the engaging hole of the flange portion. According to such insert molding, the elastic member is not likely to be removed from the flange portion, whereby it is possible to reduce trouble during transport of the substrate storing container of the wafer transport apparatus due to the detachment of the elastic member. Furthermore, although the substrate stored in the substrate storing container 1 is a silicon wafer having a diameter of 450 mm, the present invention is not limited thereto. For example, the diameter of the substrate may be 300 mm or may be made from glass wafer, sapphire wafer, etc.

Furthermore, the shapes, sizes and materials of the substrate are not limited to those of the present embodiments.

Furthermore, the thickness and the material of the elastic member are not limited to those of the present embodiments.

Furthermore, although the rigid body is attached to the top flange 4 as a locked portion by the engaging portion 451H of the rigid body 45H being engaged with the engaging hole 422H of the elastic member 42H and the engaging hole 411H of the flange portion 41H from the lower face side of the elastic member 42H and the flange portion 41H, the present invention is not limited to this configuration. For example, the rigid body may be attached to the top flange as a locked portion by the engaging portion of the rigid body being configured by the rigid body which flows into the engaging hole of the elastic member and the engaging hole of the flange portion by insert molding the rigid body having fluidity relative to the engaging hole of the elastic member and the engaging hole of the flange portion, and the upper face of the rigid body may be fixed to the lower face of the elastic member 42H.

Furthermore, the rigid body may be attached to the top flange serving as a locked portion by the upper face of the rigid body being fixed to the lower face of the elastic member by means of heat sealing and the upper face of the elastic member being fixed to the lower face of the flange portion by means of heat sealing, and the upper face of the rigid body may be fixed to the lower face of the elastic member 42H.

EXPLANATION OF REFERENCE NUMERALS 1 substrate storing container
2 container main body
3 lid body
4 top flange (locked portion)
6 arm (lifting member)

20 wall portion
21 container main body opening portion
22 back wall
23 upper wall
24 lower wall
25 first side wall (side wall)
26 second side wall (side wall)
27 substrate storing space
41, 41D, 41E, 41F, 41G, 41H flange portion
411, 411D, 411F, 411G, 411H engaging hole (through-hole)
42, 42A, 42B, 42C, 42D, 42E, 42F, 42G, 42H elastic member
421, 421D, 4221F, 421G engaging portion

The invention claimed is:

1. A substrate storing container that stores substrates composed of semiconductor wafers, the substrate storing container comprising:
a container main body including a tubular wall portion having a container main body opening portion formed at one end and the other end being closed, the wall portion including a back wall, an upper wall, a lower wall, and a pair of side walls, wherein the container main body opening portion is formed by one end of the upper wall, one end of the lower wall, and one of the ends of the side walls, wherein an inner face of the upper wall, an inner face of the lower wall, inner faces of the side walls, and an inner face of the back wall form a substrate storing space which can store a plurality of substrates and is in communication with the container main body opening;
a lid body that can be removably attached to the container main body opening portion and can close the container main body opening portion; and
a locked portion that is arranged at a center portion of the upper wall and is locked by a lifting member that can lift the container main body,
wherein the locked portion includes a plate-like flange portion having a lower face that faces the upper wall, and an elastically deformable elastic member provided at the lower face of the flange portion and/or at a rim portion of the flange portion, and
wherein an upper face of the elastic member has an engaging portion that can engage with a through-hole formed in the flange portion, and the locked portion is locked by the lifting member in a state in which the elastic member is sandwiched between the flange portion and the lifting member.

2. The substrate storing container according to claim 1, wherein a lower face of the elastic member is configured by a flat face and the lifting member can abut the flat face.

3. The substrate storing container according to claim 2, wherein the engaging portion is configured by the elastic member which flowed into the through-hole by insert molding the elastic member having fluidity relative to the flange portion molded.

4. The substrate storing container according to claim 1, wherein a lower face of the elastic member has a plurality of convex portions and the lifting member can abut the convex portions.

5. The substrate storing container according to claim 1, further comprising a rigid body having an upper face and a lower face, wherein the upper face of the rigid body is fixed to the lower face of the elastic member and the lower face of the rigid body can be abutted by the lifting member,
wherein the locked portion is locked to the lifting member in a state in which the lifting member does not abut the elastic member and the lifting member abuts the lower face of the rigid body, and the elastic member and the rigid member are sandwiched between the flange portion and the lifting member.

6. A substrate storing container that stores substrates composed of semiconductor wafers, the substrate storing container comprising:
a container main body including a tubular wall portion having a container main body opening portion formed at one end and the other end being closed, the wall portion including a back wall, an upper wall, a lower wall, and a pair of side walls, wherein the container main body opening portion is formed by one end of the upper wall, one end of the lower wall, and one of the ends of the side walls, wherein an inner face of the upper wall, an inner face of the lower wall, inner faces of the side walls, and an inner face of the back wall form a substrate storing space which can store a plurality of substrates and is in communication with the container main body opening;
a lid body that can be removably attached to the container main body opening portion and can close the container main body opening portion; and
a locked portion that is arranged at a center portion of the upper wall and is locked by a lifting member that can lift the container main body,
wherein the locked portion includes a plate-like flange portion having a lower face that faces the upper wall, and an elastically deformable elastic member provided at the lower face of the flange portion and/or at a rim portion of the flange portion,
wherein the flange portion has a convex portion at a rim, and a rim portion of the elastic member has a concave portion that can engage with the convex portion at the rim of the flange portion, and
wherein the locked portion is locked by the lifting member in a state in which the elastic member is sandwiched between the flange portion and the lifting member.

* * * * *